United States Patent [19]

Naarmann

[11] Patent Number: 4,780,246

[45] Date of Patent: Oct. 25, 1988

[54] COMPOSITES OF CONDUCTIVE POLYMERS AND INORGANIC BINDERS

[75] Inventor: Herbert Naarmann, Wattenheim, Fed. Rep. of Germany

[73] Assignee: BASF Aktiengesellschaft, Fed. Rep. of Germany

[21] Appl. No.: 35,729

[22] Filed: Apr. 8, 1987

[30] Foreign Application Priority Data

Apr. 26, 1986 [DE] Fed. Rep. of Germany ....... 3614279

[51] Int. Cl.$^4$ .......................... H01B 1/00; H01B 1/06
[52] U.S. Cl. ..................................... 252/500; 252/518; 252/519; 252/520; 252/521; 252/512; 428/500; 428/703; 106/90; 106/107; 106/111; 106/119; 106/121
[58] Field of Search ............... 252/500, 518, 519, 520, 252/521, 512; 428/500, 703; 106/89, 90, 106, 107, 110, 111, 118, 119, 121

[56] References Cited

U.S. PATENT DOCUMENTS

| | | | |
|---|---|---|---|
| 4,204,216 | 5/1980 | Heeger et al. | 357/8 |
| 4,222,903 | 5/1980 | Heeger et al. | 252/518 |
| 4,585,581 | 4/1986 | Skotheim | 252/518 |
| 4,587,037 | 5/1986 | Münstedt et al. | 252/500 |
| 4,665,129 | 5/1987 | Naarmann et al. | 252/500 |
| 4,680,236 | 7/1987 | Myers et al. | 252/500 |

FOREIGN PATENT DOCUMENTS

0099984 2/1984 European Pat. Off. .

OTHER PUBLICATIONS

J. Am. Chem. Soc. 1985, (1963), p. 454 ff.

*Primary Examiner*—Josephine Barr
*Attorney, Agent, or Firm*—Keil & Weinkauf

[57] ABSTRACT

Composites of electrically conductive materials and inorganic binders contain, as the electrically conductive material, a p- or n-doped electrically conductive polymer which possesses conjugated bonds and forms a coherent phase.

2 Claims, No Drawings

COMPOSITES OF CONDUCTIVE POLYMERS AND INORGANIC BINDERS

The present invention relates to composites of electrically conductive materials and inorganic binders.

Conductive polymers which contain conjugated double bonds are known. For example, acetylene or acetylene compounds can be polymerized in the presence of certain Ziegler catalysts. By subsequent doping, which may be effected, for example, electrochemically with electron acceptors or electron donors, it is possible to obtain electrically conductive polymers (U.S Pat. Nos. 4,204,216 and 4,222,903).

Electrically conductive polymers which are obtained by polymerization of 5-membered heterocycles, such as pyrrole or thiophene, are known from, for example, A. F. Diaz et al. J. Chem. Soc. Chem. Comm. 1979, pages 634 et seq and 845 et seq and European Laid-Open Application No. 99,984. Another group of electrically conductive polymers are the conductive poly-p-phenylenes. These can be obtained, for example, by processes as described in J. Macromol. Sci. C5 (1971), 295 et seq.

It is an object of the present invention to provide composites of electrically conductive materials and inorganic binders.

We have found that this object is achieved by composites which contain, as electrically conductive material, a p- or n-doped electrically conductive polymer which contains conjugated double bonds and forms a coherent phase.

Composites of this type are preferably used as heating elements, shielding materials and probes.

Among the polymers which contain conjugated double bonds, particularly suitable ones are those which are obtained by electrochemical polymerization of compounds from the class consisting of the 5-membered heterocyclic compounds possessing a conjugated $\pi$-electron system and contain nitrogen or sulfur as a hetero atom. Polymers from the class consisting of the pyrroles and thiophenes are advantageous. Substituted pyrroles, such as N-alkylpyrroles or monoalkyl- or dihalopyrroles, are also suitable. Compounds from the class consisting of the thiophenes are thiophene itself as well as 2- and 3-methylthiophene and 2,3-diethylthiophene. The compounds may also be copolymerized together with other copolymerizable compounds, such as diazoles or oxazoles. The polymers are prepared by the known methods cited above. Thus, the polymerization is advantageously carried out by anodic oxidation in an electrolyte solvent which contains conductive salts. Copolymers are obtained in which the conductive salt anions are bonded, these copolymers being referred to as p-doped conductive polymers.

The polymers of acetylene can be prepared in a similar manner. The method of preparation is described in the abovementioned literature. Advantageous acetylene polymers are those described in European Pat. No. 88,301 and in Synthetic Metals 5 (1982), 51. Oriented polymers are particularly suitable. Electrically conductive polymers, such as poly-p-phenylenes, are also useful.

The electrically conductive polymers are p-doped, for example with conductive salt anions, such as $I^-$, $ClO_4^-$ or $AsF_6^-$, or n-doped with $Li^+$, $Na^+$, $K^+$ or alkaline earth metal cations. Doping may be effected electrochemically or chemically.

The composites are prepared using inorganic binders. For example, nonhydraulic binders, such as gypsum, Sorel cement or magnesia binders, can be used. It is advantageous to use hydraulic binders, such as cement, lime or waterglass or other silicates, as well as borates, vanadates, titanates, ferrates, cuprates or molybdates. Salts, selenium, sulfur and silicon are also suitable. Further information on binders and cement is given in Rompps Chemie Lexikon, 7th edition, pages 366 and 3967.

In the preparation of the composites, it is necessary to ensure that the electrically conductive polymer forms a coherent phase, ie. the polymer particles are in contact with one another so that the material is conductive. Coherent phases are formed, for example, by films, filaments or wires, but it is also possible to use compression molded articles of finely powdered polymers. Knitted fabrics, woven fabrics or irregular layers of fibrous polymers may also be used. Other suitable materials are porous materials, such as open-cell membranes or nonwovens. Thus, it is possible to produce composites which are sheet-like and in which the electrically conductive polymer is present as the center layer. However, it is also possible to prepare composites which consist of only two layers, i.e. the polymer and the binder. Composites consisting of a plurality of layers may also be produced, as well as composites whose longitudinal dimension is several times the transverse dimension. These may be, for example, ribbons, cables or ropes which are surrounded by the inorganic material.

The preparation conditions depend on the inorganic binder used. Care should be taken to ensure that the temperature during the preparation does not exceed that at which the polymer may be damaged. The amount of electrically conductive polymer in the composite is from 0.001 to 0.1 part per part of binder.

As stated above, the composites may be used as probes, shielding materials or heating elements, but may also be employed as electrical control elements or as electrodes.

EXAMPLE 1

A 5 $\mu m$ polyacetylene film prepared according to European Pat. No. 88,301 is treated with an iodine-containing carbon tetrachloride solution at 23° C. for 30 minutes. The film doped in this manner has a conductivity of 2500 S/cm. It is placed between two 3 mm thick potassium bromide plates and pressed under 300 bar.

In a similar procedure, the acetylene film to be treated is placed between 3 mm thick glass plates and pressed under 300 bar and at 750° C.

The composites thus obtained can be used, for example, as probes.

EXAMPLE 2

A polyacetylene film doped as described in Example 1 is placed in waterglass solution, removed from the solution and hardened at 50° C. under 0.1 mmHg. A composite is formed in which a polyacetylene film is embedded in hardened waterglass. This composite can be used as the control element.

EXAMPLE 3

A mixture of 10 parts of sulfur and 5 parts of polypyrrole which has a conductivity of 1 S/cm and is p-doped and in the form of small particles having a diameter of 0.1 mm is compressed under 30 bar. A compression molded article is obtained in which the polypyrrole particles are embedded in the sulfur and form a coherent phase. A compression molded article of this type can be used as a probe.

EXAMPLE 4

The particles used have a diameter of 1-2 mm and consist of polypyrrole deposited on graphite particles. The conductivity of these particles is 1 S/cm. The particles are mixed with cement and water in a ratio of 1:1:3. The mixture is left to harden for 3 days at 25° C. The amount of polypyrrole in the composite is 20% by weight, the polypyrrole particles forming a coherent phase.

Polypyrrole fibers which have a diameter of 1 mm, a length of 3-5 mm and a conductivity of 2 S/cm are incorporated in the same manner. A composite is obtained in which the polypyrrole fibers form the coherent phase.

A 200 $\mu$m thick polypyrrole film is placed in a cement mixture. The mixture is introduced into a mold so that each film is coated on both sides with a 1 cm layer of cement. The cement is allowed to harden and a composite is obtained in which the polypyrrole component has a conductivity of $10^{-3}$ S/cm.

EXAMPLE 5

A 200 $\mu$m polypyrrole film s incorporated in gypsum in a manner similar to that described in Example 4, so that the polypyrrole film is coated on both sides with a 5 mm layer. When hardening is complete, a composite is obtained. The conductivity of the polypyrrole film in the composite is 150 S/cm.

A composite which contains a polyacetylene film which is n-doped with lithium anions can be produced in the same manner.

I claim:

1. A shaped composite comprising a p- or n- doped electrically conductive polymer which forms a coherent phase and an inorganic binder, said polymer being characterized by the presence of conjugated double bonds and selected from the group consisting of acetylene, pyrrole and poly-p-phenylene polymers, said inorganic binder being of the hydraulic or nonhydraulic and selected from the group of materials consisting of gypsum, Sorel cement, magnesia, cement, lime, silicates, borates, vanadates, titanates, ferrates, cuprates, molybdates, selenium, sulfur and silicon, and wherein said electrically conductive polymer is present in an amount of from 0.001 to 0.1 part per part of said binder.

2. A shaped composite comprising a p- or n- doped electrically conductive polypyrrole polymer which forms a coherent phase and a cement binder, and wherein said electrically conductive polymer is present in an amount of from 0.001 to 0.1 part per part of said binder.

* * * * *